United States Patent Office 3,556,792

Patented Jan. 19, 1971

3,556,792

NOVEL SUBSTITUTED ALLYL POLYMER DERIVATIVES USEFUL AS PHOTORESISTS

Leon Katz, Springfield, N.J., assignor to GAF Corporation, New York, N.Y., a corporation of Delaware No Drawing. Filed May 22, 1968, Ser. No. 731,279
Int. Cl. G03c *1/68, 1/69*
U.S. Cl. 96—35.1 14 Claims

ABSTRACT OF THE DISCLOSURE

Light-sensitive, organic solvent-soluble, film-forming substituted allyl containing polymers suitable for use as photoresists.

This invention relates to novel light-sensitive, organic solvent-soluble substituted allyl group containing polymers and, in particular, those containing reactive moieties in the $\beta$ position of the allyl group, and their preparation by reaction of the aforesaid substituted allyl compounds with certain polymeric intermediates containing reactive groups to form novel light-sensitive, organic solvent-soluble polymers.

The invention also relates to the use of said light-sensitive polymers as photoresists wherein, after coating on suitable surfaces, their propensity to crosslink (i.e. polymerize) under the action of actinic radiation is used to form organic solvent-insoluble compounds. Subsequent removal from the surface of the unexposed portion of the polymer coating by organic solvent development leaves intact thereon the exposed, crosslinked polymer. Such photoresists are useful, for example, in the manufacture of printed circuits, for making printing plates, for making semiconductors for integrated circuits and for other analogous functions.

To provide the aforesaid crosslinking ability, polymers suitable for photoresists usually contained pendant groups which had a degree of unsaturation and, vicinal thereto, an electron withdrawing group. Early work on this phenomenon of light sensitivity involved compounds containing cinnamic acid residues and derivatives thereof as, for example, the following:

cinnamoyl polystyrene resin,

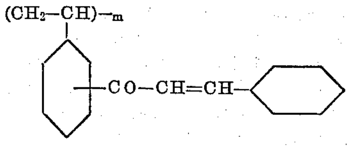

cinnamic acid esters of polyvinyl alcohol,

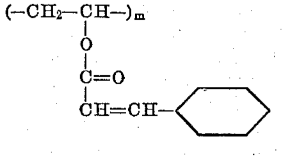

a copolymer of styrene-maleic anhydride esterified with N-(m-hydroxymethylphenyl)-cinnamamide,

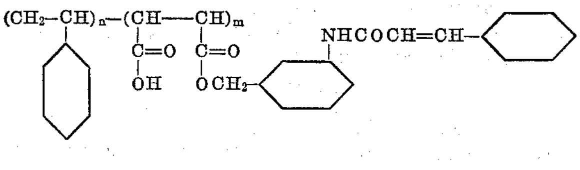

and the reaction product of vinyl acetate/maleic anhydride with 3-amino-benzalacetophenone

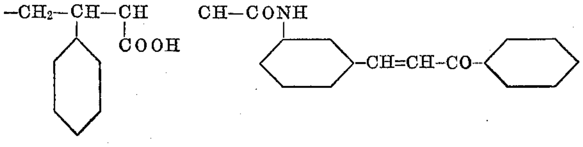

Heretofore, it was thought that a requirement for light-sensitive polymers of the aforesaid classes—in particular, cinnamyl polymers—was the presence of a conjugated system resulting from the location of the carbonyl group adjacent to the carbon-carbon double bond. However, by the process of this invention, compounds suitable for photoresists have been prepared in which no such conjugated system is present but in which there is an electron—with drawing group on the $\beta$ carbon atom of the allyl structure.

It was known heretofore to prepare photo-sensitive materials containing esters of resinous copolymers of maleic acid, as set out in U.S. Pats. 2,980,534 and 2,990,-281, but as disclosed in these references, these materials required inclusion with the copolymer esters of photo-sensitive diazo compounds, dichromates, iron systems, iron-silver systems, silver salts or mixtures thereof.

This invention is based on the discovery that certain $\beta$-substituted allyl compounds form, with copolymers of maleic anhydride, polymers of acid halides or polymers of unsaturated acids, light-sensitive, solvent-soluble polymers which are excellent materials for photoresists in the absence of other light-sensitive compounds.

This invention is also based on the discovery that the aforesaid light-sensitive compounds are suitable as photoresists in the ultraviolet region with or without the addition of sensitizers which enhance or modify the light-senstivity of said compounds.

The substituted allyl compounds which are preferred reactants of this invention have the general formula:

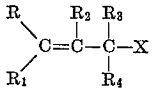

in which R is hydrogen, aryl, alkyl, alkyl substituted aryl in which in both cases the alkyl substituent has from 1 to 3 carbon atoms, fluorine, bromine, chlorine, carboxy or sulfonic acid groups;

$R_1$ is hydrogen, aryl, alkyl, alkoxy, aryloxy, mono-, di-, or tri-substituted aryl or aryloxy in which the substituents include hydroxy alkyl and alkoxy groups containing from 1 to 3 carbon atoms, benzyloxy, fluoro, chloro, bromo, nitro, carboxy, sulfonic acid, furanyl, cycloalkyl, aliphatic carboacyl, aliphatic carboacyloxy, aroyl, aroyloxy, cyano, alkyl sulfonyl, aryl sulfonyl, carbalkoxy or like groups;

$R_2$, the electron withdrawing group, is a member selected from the group consisting of chloro, bromo, iodo, fluoro, nitro, cyano, carboxyl, carbethoxy and sulfonic acid;

$R_3$ and $R_4$ are hydrogen, aryl, substituted aryl wherein the substituents are alkyl or alkoxy of 1 to 3 carbon atoms; chloro, bromo, nitro, amino, or alkyl sulfonyl groups; and X is hydroxy, amino, monoalkylamino, monoalkenylamino, monoarylamino or mercapto. Examples of representative compounds are:

2-chloro-3-phenyl-2-propen-1-ol (2-chlorocinnamyl alcohol)
2-bromo-3-phenyl-2-propen-1-ol (2-bromocinnamyl alcohol)
2-bromo-3-(4-nitrophenyl)-2-propen-1-ol 2-fluoro-3-phenyl-2-propen-1-ol (2-fluorocinnamyl alcohol)
2-fluoro-3-(4-methoxyphenyl-2-propen-1-ol
2-nitro-3-chloro-3-phenyl-2-propen-1-ol
2-nitro-3-phenyl-2-propen-1-ol (2-nitrocinnamyl alcohol)
2-cyano-3-phenyl-2-propen-1-ol (2-cyanocinnamyl alcohol)
2-chloro-2-propen-1-ol (2-chloroallyl alcohol)
2-bromo-2-propen-1-ol (2-bromoallyl alcohol)
2-carboxy-2-propen-1-ol (2-carboxyallyl alcohol)
2-carbethoxy-2-propen-1-ol (2-carbethoxyallyl alcohol)
2-sulfonic acid-2-propen-1-ol (2-sulfonic acid allyl alcohol)
2-nitro-2-propen-1-ol (2-nitroallyl alcohol)
2-bromo-3,3-difluoro-2-propen-1-ol
2-chloro-3,3-difluoro-2-propen-1-ol
2-fluoro-3-chloro-2-propen-1-ol
2,3-dibromo-3-carboxy-2-propen-1-ol
2,3-diiodo-3-carboxy-2-propen-1-ol
2,3-dibromo-2-propen-1-ol
2-chloro-3-methyl-2-propen-1-ol
1-methyl-1-(2-chloro-2-propenyl)amine
1-methyl-1-(2-bromo-2-propenyl)amine
2-bromo-2-propenyl-1-amine(2-bromoallyl amine)
2-bromo-2-propen-1-thiol The maleic anhydride copolymers used in preparing light-sensitive polymers of this invention have, in general, substantially equimolar proportions of maleic anhydride and an ethylenically unsaturated monomer polymerizable therewith. Some typical copolymers suitable for preparation of the light-sensitive polymers of this invention, their mol ratios and relative viscosities are given in the table below:

| Copolymer | Mol ratio | Relative viscosity |
|---|---|---|
| Methyl vinyl ether/maleic anhydride | 1:1 | [1] 4.0 |
| n-Butyl vinyl ether/maleic anhydride | 1:1 | [1] 2.2 |
| Do | 1:1 | [1] 1.59 |
| Isobutyl vinyl ether/maleic anhydride | 1:1 | [1] 3.93 |
| Do | 1:1 | [1] 1.66 |
| Octadecyl vinyl ether/maleic anhydride | 1:1 | [1] 1.91 |
| Isooctyl vinyl ether/maleic anhydride | 1:1 | [1] 1.91 |
| Dodecyl vinyl ether/maleic anhydride | 1:1 | [1] 1.52 |
| Cetyl vinyl ether/maleic anhydride | 1:1 | [1] 1.20 |
| Styrene/maleic anhydride | 1:1 | [2] 2.82 |
| Ethylene/maleic anhydride | 1.5:1 | [2] 2.44 |
| Vinyl pyrrolidone/maleic anhydride | 1:1 | [3] 1.16 |

[1] In 1% methyl ethyl ketone.
[2] 1% in N-methyl-2-pyrrolidinone.
[3] 1% in $H_2O$.

These compounds are prepared by methods such as, for example, those described in U.S. Pat. 2,047,398.

Polymeric acids suitable for preparation of the light-sensitive polymers of this invention are prepared by the polymerization of unsaturated acids as, for example, acrylic and methacrylic acid. The polymeric acid halides suitable as intermediates for the light-sensitive polymers of this invention are, in turn, prepared by either the direct polymerization of unsaturated acid halides or by the conversion of the aforesaid polymerized acids into the acid halides e.g., by reaction with thionyl chloride.

The aforesaid polymers are reacted with β-substituted allyl alcohol, amine or mercaptan to yield the corresponding ester, amide or thioester. In general, the reaction is run in either an excess of the allyl compound, in an inert solvent such as 2-methoxyethyl acetate, xylene, acetone, methylethyl ketone, ethanol, toluene and cyclohexanol or, as is the case with the polymeric acid halides, in a reactive solvent which is a hydrogen halide acceptor, such as pyridine. Reaction temperature is dependent on the reactants and their reactivities. Various acid-base catalysts may be employed as needed.

The resulting compounds consist of polymers having a backbone of either a maleic anhydride copolymer, an unsaturated acid polymer or an acid halide polymer such that they have recurring structural units of the general formula:

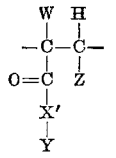

in which W is hydrogen, alkyl, aryl, chlorine or bromine, X′ is oxygen, sulfur or

in which R is hydrogen, alkyl, alkenyl or aryl; Y is a substituted allyl radical corresponding to the formula

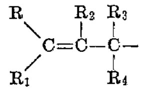

as defined hereinabove; Z is hydrogen, alkyl, alkoxy, aryl, aryloxy, —CO—O—M or —COX′—Y in which M is hydrogen, a metal ion, ammonium ion, a substituted ammonium ion, alkyl or aryl and X′ and Y have the significance as discussed above. The remaining recurring structural unit of the maleic anhydride copolymer is either an alkyl vinyl ether, ethylene, styrene or vinyl pyrrolidone.

The preferred compounds of this invention include condensation polymers of the following compounds with the maleic anhydride copolymers listed previously: 2-halocinnamyl alcohols, 2-nitrocinnamyl alcohol, 2-cyanocinnamyl alcohol, 2-haloallyl alcohols, 2-nitroallyl alcohol, 2-carboxyallyl alcohol, 2-carbethoxy-2-sulfonic acid allyl alcohol, 2-haloallyl mercaptans, 2,3-dihaloallyl alcohols, 2,3,3-trihaloallyl alcohols, 2-halo-3-alkylallyl alcohols; the products of interesterification, interamidation or interthioesterification of polymers of unsaturated acids especially acrylic acids as, for example, polymethyl acrylate or polymethyl methacrylate by reaction with the aforesaid substituted allyl alcohols, amines, or mercaptans; and reaction products of polymers of the unsaturated acid halides as, for example, poly(acrylyl chloride) and poly(methacrylyl chloride) with the aforesaid substituted allyl alcohols, amines or mercaptans.

In the case of maleic anhydride copolymers, suitable polymers can be prepared by reacting 50 to 100% of the anhydride moiety with the substituted allyl compound, the preferred range being from 70 to 100% reaction.

In the interesterification reaction of polyunsaturated acid esters, and esterification, amidation or thioesterification of polyunsaturated acid halides, suitable photoresists are prepared when 50% of the esterified alcohol or halide moiety is replaced by the substituted allyl moiety. The preferred range is 55 to 100% substitution.

The resulting polymers are sensitive to light exposure, particularly in the ultraviolet region, without the use of sensitizers. However, sensitizers can be used to increase the sensitivity, especially in the visible region. Examples of such sensitizer compounds include nitro-anilines as described in U.S. Pat. 2,610,121; quinones, benzanthrones and triphenyl methane dyes as reported in U.S. Pats. 2,670,285; 2,670,286 and 2,690,966; ketone compounds as reported in U.S. Pat. 2,670,287; and 1 - methyl - 2-benzoylmethylene-β - naphthothiazoline and other arylothiazolines as reported in U.S. Pats. 2,112,139 and 2,732,301.

Several examples are set forth below to illustrate the nature of the invention and the manner of carrying it out. However, the invention should not be considered as limited to the details thereof.

EXAMPLES 1–40

These examples illustrate the synthesis of the substituted allyl half-esters of the maleic anhydride copolymers and of polymeric unsaturated acids or halides and the suitability of the resulting light-sensitive, organic solvent-soluble polymers as photoresists.

In general the compounds are prepared by heating the anhydride copolymer, or a polymeric unsaturated acid ester of halide, together with the substituted allyl alcohol, amide or mercaptan in an excess of the substituted allyl compound or in an inert solvent. The table below lists the reactants, their quantities, solvents and reaction conditions. The resulting substituted allyl half-ester polymers were isolated by precipitation with carbon tetrachloride, filtered and prepared for coating by dissolution in suitable organic solvents.

half-esters of Examples 1–15 employing standard film techniques using, in particular, a 6 mil film applicator. Although only a glass surface was used as the supports the compounds can be applied as a film to other desirable substrates such as copper or zinc.

The coated plates were dried in an oven at 55–60° C., for 10 minutes and were then exposed, through a negative positioned over the plate, for 10 minutes to the radiation from a 450 watt Hanovia quartz lamp positioned 6 inches from the plate and having a 280 mμ cut-off Corex filter. Development was effected by washing with a solvent for

| Ex. No. | Copolymer: maleic anhydride+equimolar quantity of— | Quantity of copolymer, g. | Allyl compound | Quantity of allyl compound, g. | Solvent | Reaction conditions | |
|---|---|---|---|---|---|---|---|
| | | | | | | Temp., °C. | Time, hrs. |
| 1 | Methyl vinyl ether | 7.8 | 2-chlorocinnamyl alcohol | 42.1 | 2-chlorocinnamyl alcohol | 90–95 | 3 |
| 2 | do | 7.8 | 2-chloroallyl alcohol | 55.5 | 2-chloroallyl alcohol | 90–95 | 3 |
| 3 | do | 15.6 | 2-bromoallylamine | 27 | 2-bromoallylamine | 25–30 | 24 |
| 4 | do | 15.6 | 2-bromocinnamyl alcohol | 84.2 | 2-butanone | 76–78 | 15 |
| 5 | do | 15.6 | 3-carboxy-2,3-dibromo allyl alcohol. | 130 | do | 80 | 15 |
| 6 | do | 15.6 | 3-carboxy-2,3-diiodoallyl alcohol. | 179 | do | 80 | 15 |
| 7 | do | 15.6 | 2,3-dibromoallyl alcohol | 108 | do | 80 | 15 |
| 8 | do | 15.6 | N-methyl-2-bromoallylamine | 75 | do | 80 | 15 |
| 9 | N-butyl vinyl ether | 3.96 | 2-chlorocinnamyl alcohol | 25.3 | do | 85 | 2 |
| 10 | do | 3.96 | 2-fluorocinnamyl alcohol | 22.8 | do | 85 | 2 |
| 11 | Isobutyl vinyl ether | 3.96 | 2-chlorocinnamyl alcohol | 25.3 | do | 85 | 2 |
| 12 | do | 3.96 | 2-nitrocinnamyl alcohol | 28.0 | do | 85 | 2 |
| 13 | Octadecyl vinyl ether | 3.57 | 2-chlorocinnamyl alcohol | 25.3 | do | 85 | 2 |
| 14 | Isooctyl vinyl ether | 2.54 | 2-cyanocinnamyl alcohol | 24.0 | do | 90–95 | 3 |
| 15 | Dodecyl vinyl ether | 3.10 | 2-chlorocinnamyl alcohol | 25.3 | do | 90–95 | 3 |
| 16 | Cetyl vinyl ether | 3.66 | do | 25.3 | do | 95 | 3½ |
| 17 | Styrene | 2.02 | do | 16.9 | do | 85 | 2 |
| 18 | Ethylene* | 1.38 | do | 16.9 | do | 85–90 | 2 |
| 19 | N-vinyl-2-pyrrolidone | 10.45 | do | 42.1 | 2-chlorocinnamyl alcohol | 85 | 4 |
| 20 | Methyl vinyl ether | 7.8 | 2-bromocinnamyl mercaptan | 55 | 2-bromocinnamyl mercaptan | 90–95 | 3 |
| 21 | Styrene | 2.02 | do | 22 | do | 90–95 | 3 |
| 22 | Ethylene | 1.38 | do | 22 | do | 90–95 | 3 |
| 23 | N-vinyl-2-pyrrolidone | 10.45 | do | 55 | do | 90–95 | 3 |
| 24 | Styrene | 2.02 | 3-carboxy-2,3-dibromoallyl-alcohol. | 26 | 2-butanone | 80 | 2 |
| 25 | Ethylene | 1.38 | 3-carboxy-2,3-diiodoallyl alcohol. | 35.4 | do | 80 | 2 |
| 26 | N-vinyl-2-pyrrolidone | 10.45 | 2,3-dibromoallyl alcohol | 54 | do | 80 | 4 |
| 27 | do | 10.45 | N-methyl-2-bromoallylamine | 37.5 | do | 80 | 4 |
| 28 | Poly(methylacrylate) | 4.3 | 2-chlorocinnamyl alcohol | 42.1 | 2-chlorocinnamyl alcohol | 90–95 | 3 |
| 29 | Poly(acrylic chloride) | 4.5 | 2-bromocinnamyl alcohol | 53 | 2-bromocinnamyl alcohol | 90–95 | 3 |
| 30 | Poly(methacrylic chloride) | 5.2 | 2-cyanocinnamyl alcohol | 40 | 2-cyanocinnamyl alcohol | 90–95 | 3 |
| 31 | Poly(methylacrylate) | 4.3 | 2-chloroallyl alcohol | 55.5 | 2-chloroallyl alcohol | 90–95 | 3 |
| 32 | Poly(acrylic chloride) | 4.5 | 2-carboxyallyl alcohol | 61.2 | 2-butanone | 80 | 3 |
| 33 | Poly(methacrylic chloride) | 5.2 | 2-nitroallyl alcohol | 61.8 | do | 80 | 3 |
| 34 | Poly(methylacrylate) | 8.6 | 2-bromoallylamine | 27 | 2-bromoallylamine | 80 | 8 |
| 35 | Poly(acrylic chloride) | 9 | do | 27 | do | 80 | 8 |
| 36 | Poly(methacrylic chloride) | 10.4 | do | 27 | do | 80 | 8 |
| 37 | Poly(methylacrylate) | 4.3 | 3-carboxy-2,3-dibromoallyl alcohol. | ------------- | 2-butanone | 80 | 3 |
| 38 | do | 4.3 | 3-carboxy-2,3-diiodoallyl alcohol. | 80.5 | do | 80 | 3 |
| 39 | Poly(acrylic chloride) | 4.5 | 2,3-dibromoallyl alcohol | 54 | do | 80 | 3 |
| 40 | Poly(methacrylic chloride) | 5.2 | N-methyl-2-bromoallylamine | 42 | do | 80 | 3 |

*1 mole maleic anhydride to 1.5 moles of ethylene.

To illustrate the utility of the aforesaid half-esters as photoresists, films were cast from the solutions of the the unexposed polymer. The table below lists the half-esters evaluated, the coating solvent and the development solvent. Wet film thickness was 6 mils in all cases except mor a 3 mil wet film cast from the half-ester of the ethylene/maleic anhydride copolymer. The example numbers correspond to the numbers used earlier and thereby indicate the polymer composition.

| Example | Coating solvent | Development solvent |
|---|---|---|
| 1 | Acetone | Acetone. |
| 2 | Methylethyl ketone | Methylethyl ketone. |
| 3 | Methylisobutyl ketone | Methylisobutyl ketone. |
| 4 | Methylethyl ketone | 75 methylethyl ketone/25 methoxyethyl acetate. |
| 5 | 75 methylethyl ketone/25 methoxyethyl acetate. | Do. |
| 6 | do | Do. |
| 7 | Methylethyl ketone | Do. |
| 8 | do | Do. |
| 9 | do | 75 methylethyl ketone/25 ethoxyethyl acetate. |
| 10 | do | Do. |
| 11 | Methylisobutyl ketone | Do. |
| 12 | do | Do. |
| 13 | 75 xylene/25 methoxyethyl acetate. | 75 xylene/25 methoxyethyl acetate. |
| 14 | do | Do. |
| 15 | do | Do. |
| 16 | do | Do. |
| 17 | Methylethyl ketone | Methylethyl ketone. |
| 18 | do | Do. |
| 19 | 75 chloroform/25 ethanol | 50 dhloroform/50 water. |
| 20 | Acetone | 75 acetone/25 metho yethyl acetate. |
| 21 | Methylethyl ketone | 75 methylethyl ketone/ 25 methoxyethyl acetate. |
| 22 | do | Do. |
| 23 | 75 chloroform/25 ethanol | 50 chloroform/50 water. |
| 24 | 75 methylethyl ketone/ 25 methoxyethyl acetate. | 75 methylethyl ketone/25 methoxyethyl acetate. |
| 25 | do | Do. |
| 26 | 75 chloroform/25 ethanol | 50 chloroform/50 water. |
| 27 | do | Do. |
| 28 | Methylethyl ketone | 75 methylethyl ketone/25 methoxyethyl acetate. |
| 29 | 75 xylene/25 methoxyethyl acetate. | 75 xylene /25 methoxyethyl acetate. |
| 30 | do | Do. |
| 31 | Methylethyl ketone | 75 methylethyl ketone/25 methoxyethyl acetate. |
| 32 | 75 xylene/25 methoxyethyl acetate. | 75 xylene/25 methoxyethyl acetate. |
| 33 | do | Do. |
| 34 | Methylethyl ketone | 75 methylethyl ketone/25 methoxyethyl acetate. |
| 35 | 75 xylene 25 methoxyethyl acetate. | 75 xylene/25 methoxyethyl acetate. |
| 36 | do | Do. |
| 37 | 75 methylethyl ketone/25 methoxyethyl acetate. | 75 methylethyl ketone/25 methoxyethyl acetate. |
| 38 | do | Do. |
| 39 | 75 methylethyl ketone/25 ethoxyethyl acetate. | 75 methylethyl ketone/ 25 ethoxyethyl acetate. |
| 40 | 75 methylethyl ketone/25 methoxyethyl acetate. | 75 methylethyl ketone/ 25 methoxyehtyl acetate. |

All of the resulting photoresists were rated good to excellent.

EXAMPLES 41–45

These examples illustrate the effect of sensitizer addition to a 2-chlorocinnamyl half-ester derivative of methyl vinyl ether/maleic anhydride when the photoresist is prepared by exposure to visible light.

For Examples 41 to 45, a sufficient quantity of the 2-chlorocinnamyl half-ester of methyl vinyl ether/maleic anhydride copolymer as prepared in Example 1 above was dissolved in acetone to prepare a 4.5% solution. After addition of a sensitizer, a 3 mil wet film was applied to a glass surface and dried for 10 minutes in an oven at 60° C. A high contrast negative was placed over the coated plate, the plate was then positioned 6 inches from the level of a 35 mm. slide projector and was exposed to the radiation from a 300 watt lamp for 5 minutes. Photoresists development was effected by washing with acetone. In Example 45, a 6% solution of the 2-chlorocinnamyl ester of methylvinyl ether-maleic anhydride was used, after addition of sensitizer, to apply a 1 micron film to a glass surface. After drying, the coated surface was exposed, through a step wedge having density increases in 1.414 increments, to the radiation from a 200 watt high pressure mercury vapor lamp with development effected by washing with methylethyl ketone. The sensitizers and their quantities are tabulated below. Good to excellent quality photoresists were formed on exposure of the sensitized coatings to visible light while no photoresist formed on exposure of the unsensitized coating.

| Example | Sensitizer | Concentration based on polymer percent |
|---|---|---|
| 41 | Blank | |
| 42 | 1,2-benzoanthraquinone | 5 |
| 43 | 4,4′-bis(dimethylamino)benzophenone | 5 |
| 44 | 2,4,6-trinitroaniline | 5 |
| 45 | 1-methyl-2-benzoylmethylene-β-naphthol-thiazoline | 10 |

EXAMPLES 46–49

These examples illustrate not only the superior performance of the light-sensitive polymers of this invention in comparison to that of a commercial polyvinyl cinnamate based photoresist but also the compatibility of said polymers with stabilizers, both in solution and in subsequent photoresist performance.

Three 6% solutions of 2-chlorocinnamyl alcohol ester of methylvinyl ether-maleic acid copolymer were prepared containing no stabilizer (Example 46), 0.1% by weight of polymer of 4-methoxyphenol (Example 47) and 0.1% by weight of polymer of 2,6-ditertiary butylphenol (Example 48). To each solution was added 10% by weight of polymer of 1-methyl-2-benzoylmethylene-β-naphtho-thiazoline sensitizer. One micron thick films on glass surfaces, prepared from the above solutions as well as from the aforesaid commercial photoresist (Example 49), were exposed, through a step wedge having density gradients in 1.414 increments, to the radiation from a 200 watt high pressure mercury vapor lamp. Photoresist development was effected by washing with methylethyl ketone.

The results show that the polymers of this invention are much more sensitive to visible light than the commercial light-sensitive polymer evaluated. At the same time, no deleterious effect due to the stabilizer addition was noted.

While exemplary embodiments of the invention have been described, the true scope of the invention is to be determined from the following claims.

What is claimed is:

1. A light-sensitive element which comprises a base having a surface coated with a light-sensitive, organic solvent-soluble film forming polymer prepared by the reaction of (a) a polymer selected from the class consisting of copolymers of maleic anhydride with a monomer selected from the class consisting of alkylvinyl ether, ethylene, styrene and vinylpyrrolidonone; polymers of ethylenically unsaturated carboxy acids, their esters and the corresponding acid halides with (b) an allyl compound having the general formula:

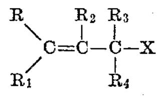

wherein R is a member selected from the class consisting of hydrogen, alkyl of 1 to 3 carbon atoms, aryl, alkyl substituted aryl wherein the substituent has from 1 to 3 carbon atoms, halogen, carboxy and sulfonic acid groups;

$R_1$ is a member selected from the class consisting of hydrogen, aryl, alkyl, alkoxy's, aryloxy, aryl substituted with hydrogen, alkyl or alkoxy groups aryloxy substituted with hydroxy, alkyl or alkoxy groups, aliphatic carboacyl, aliphatic carboacyloxy, aroyl, aroyloxy, cyano, alkylsulfonyl, arylsulfonyl and carbalkoxy groups;

$R_2$ is a member selected from the class consisting of chloro, bromo, iodo, fluoro, nitro, cyano, carboxyl, carbethoxy and sulfonic acid groups;

$R_3$ and $R_4$ are members selected from the class consisting of hydrogen, aryl, alkyl substituted aryl, alkoxy substituted aryl, chloro, bromo, nitro, amino and alkyl sulfonyl groups; and X is a member selected from the class consisting of hydroxy, amino, monoalkylamino, monoalkenylamino, monoarylamino and mercapto groups, such that the resulting polymer consists of from 25 to 50 mol percent of recurring structural units having the general formula:

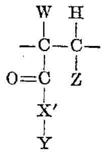

wherein W is a member selected from the class consisting of hydrogen, alkyl, aryl, chlorine and bromine; X' is a member selected from the class consisting of oxygen, sulfur and $$-\overset{|}{N}-R_1$$

wherein $R_1$ is a member selected from the class consisting of hydrogen, alkyl, alkenyl and aryl; Y is a substituted allyl group of the general formula

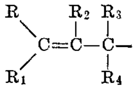

wherein R, $R_1$, $R_2$, $R_3$ and $R_4$ have the significance as detailed above and Z is a member selected from the class consisting of hydrogen, alkyl, alkoxy, aryl, aryloxy, —COOM and CO—X'—Y wherein X' and Y have the significance as detailed above and M is a member selected from the class consisting of hydrogen, a metallic ion, ammonium ion, substituted ammonium ion, alkyl and aryl and the remaining recurring structural units of the polymer being the polymerized moiety selected from the class consisting of (a) above, said resulting polymer being the sole light-sensitive component of said composition.

2. A light-sensitive element as defined in claim 1 wherein said resulting polymer is β-substituted cinnamyl alcohol ester of an alkylvinyl ether-maleic acid copolymer.

3. A light-sensitive element as defined in claim 1 wherein said resulting polymer is a 2-chlorocinnamyl alcohol ester of a methylvinyl ether-maleic acid copolymer.

4. A light-sensitive element as defined in claim 1 wherein said resulting polymer is a 2-chlorocinnamyl alcohol ester of a styrene-maleic acid copolymer.

5. A light-sensitive element as defined in claim 1 wherein said resulting polymer is a 2-chlorocinnamyl alcohol ester of an N-vinylpyrrolidone-maleic acid copolymer.

6. A light-sensitive element as defined in claim 1 wherein said element contains a sensitizer selected from the group consisting of 1,2-benzoanthraquinone, 4,4'-bis (dimethylamino)benzophenone, 2,4,6-trinitroaniline and 1-methyl-2-benzoylmethylene-β-naphthothiazoline.

7. A method for preparing a photoresist which comprises (a) coating a surface with a solution of a light-sensitive, organic solvent-soluble, film-forming polymer as defined in claim 1, (b) drying the coating, (c) exposing the coated surface to light through a negative and (d) developing the photoresist by dissolution of the unexposed polymer in an organic solvent.

8. A method as described in claim 7 wherein the light-sensitive, organic solvent-soluble, film-forming polymer is a 2-chlorocinnamyl alcohol ester of a methylvinyl ether-maleic acid copolymer.

9. A method as described in claim 7 wherein a sensitizer selected from the class consisting of 1,2-benzoanthraquinone, 4,4' - bis(dimethylamino)benzophenone, 2,4,6-trinitroaniline and 1-methyl-2-benzoylmethylene-β-naphthothiazoline is included in the solution of the film-forming polymer.

10. A coating composition for application to a base which comprises a solution of a light-sensitive, organic solvent-soluble, film-forming polymer, as defined in claim 1, in a volatile organic solvent.

11. A coating composition as defined in claim 10 in which the 2-chlorocinnamyl alcohol ester of methylvinyl ether-maleic acid copolymer is dissolved in 2-butanone.

12. A coating composition as defined in claim 10 in which the 2-chlorocinnamyl alcohol ester of styrene-maleic acid copolymer is dissolved in 2-butanone.

13. A coating composition as defined in claim 10 in which the 2-chlorocinnamyl alcohol ester of an N-vinylpyrrolidone-maleic acid copolymer is dissolved in a chloroform-ethanol solvent mixture.

14. A coating composition as defined in claim 10 wherein a sensitizer selected from the class consisting of 1,2 - benzoanthraquinone, 4,4'-bis(dimethylamino)benzophenone, 2,4,6 - trinitroaniline and 1 - methyl-2-benzoylmethylene-β-naphthothiazoline is included in the solution of the film-forming polymer.

References Cited

UNITED STATES PATENTS

| | | | |
|---|---|---|---|
| 2,980,534 | 4/1961 | Printy et al. | 96—35.1 |
| 2,990,281 | 6/1961 | Printy et al. | 96—35.1 |
| 3,376,138 | 4/1968 | Giangualano et al. | 96—35.1 |

RONALD H. SMITH, Primary Examiner

U.S. Cl. X.R.

96—115

Disclaimer 3,556,792.—*Leon Katz,* Springfield, N.J. NOVEL SUBSTITUTED ALLYL POLYMER DERIVATIVES USEFUL AS PHOTORESISTS. Patent dated Jan. 19, 1971. Disclaimer filed Sept. 30, 1982., by the assignee, *Eastman Kodak Co.*

Hereby enters this disclaimer to all claims of said patent.

[*Official Gazette April 5, 1983.*]